US012610627B2

(12) United States Patent
Yoshikawa Funakoshi

(10) Patent No.: US 12,610,627 B2
(45) Date of Patent: Apr. 21, 2026

(54) SOLAR CELL MODULE

(71) Applicant: SHARP KABUSHIKI KAISHA, Sakai City (JP)

(72) Inventor: Yasushi Yoshikawa Funakoshi, Sakai City (JP)

(73) Assignee: SHARP KABUSHIKI KAISHA, Sakai City (JP)

( * ) Notice: Subject to any disclaimer, the term of this patent is extended or adjusted under 35 U.S.C. 154(b) by 0 days.

(21) Appl. No.: 18/726,430

(22) PCT Filed: Jan. 10, 2023

(86) PCT No.: PCT/JP2023/000259
§ 371 (c)(1),
(2) Date: Jul. 3, 2024

(87) PCT Pub. No.: WO2023/136232
PCT Pub. Date: Jul. 20, 2023

(65) Prior Publication Data
US 2025/0081633 A1      Mar. 6, 2025

(30) Foreign Application Priority Data
Jan. 14, 2022     (JP) ................................. 2022-004582

(51) Int. Cl.
*H10F 19/90*      (2025.01)
*H02S 40/34*      (2014.01)

(52) U.S. Cl.
CPC ........... *H10F 19/902* (2025.01); *H02S 40/34* (2014.12)

(58) Field of Classification Search
None
See application file for complete search history.

(56)              References Cited

U.S. PATENT DOCUMENTS

2016/0141435 A1* 5/2016 Sridhara ............ G05B 19/4155
                                                              136/244
2019/0081185 A1* 3/2019 Lee ....................... H10F 19/902
2023/0158593 A1   5/2023 Sridhara et al.

FOREIGN PATENT DOCUMENTS

GB            2515837 A      1/2015
JP            2020-098931 A  6/2020

* cited by examiner

*Primary Examiner* — Dustin Q Dam
(74) *Attorney, Agent, or Firm* — ScienBiziP, P.C.

(57)              ABSTRACT
A solar cell module is provided with a first solar cell string including a plurality of first solar cells and a second solar cell string including a plurality of second solar cells. The first solar cell string and the second solar cell string are connected in parallel to each other. The first solar cell and the second solar cell are split solar cells. The first solar cell string and the second solar cell string are arranged in a first direction of the solar cell module. A parallel connection part is interposed between the first solar cell string and the second solar cell string. The parallel connection part is provided away from a center line of the solar cell module in the first direction.

5 Claims, 10 Drawing Sheets

| L1/L2 | Pmax [W] |
|---|---|
| 1 | 358.1 |
| 0.9 | 358.1 |
| 0.8 | 358.0 |
| 0.7 | 357.8 |
| 0.6 | 357.4 |
| 0.5 | 356.8 |
| 0.4 | 356.0 |
| 0.33 | 355.2 |
| 0.3 | 354.8 |
| 0.25 | 354.0 |
| 0.2 | 353.0 |
| 0.17 | 352.3 |
| 0.15 | 351.9 |
| 0.125 | 351.2 |
| 0.11 | 350.8 |
| 0.1 | 350.4 |

SOLAR CELL MODULE

TECHNICAL FIELD

The present disclosure relates to solar cell modules using split cells as solar cells.

BACKGROUND ART

Solar cell modules are well known, in which solar cells made of semiconductor materials such as Si semiconductors are used. Recently, there has been a rise in demand for a solar cell module whose product unit price per 1 W is reduced, which requires module size enlargement by increasing the number of the solar cells constituting the solar cell module, or reduction in the amount of material used for a slimmed frame member.

Also, in such a solar cell module, half cells are occasionally used as solar cells constituting the solar cell module as shown, for example, in Patent Document 1. The half cell is made by dividing a standard sized solar cell into two equal cells. Such a half cell is a split cell made by dividing the standard sized solar cell (full cell) having a substantially square shape in half, which leads to decrease in the current value per solar cell (decreases in half in case of division in half), prevention of power loss of the solar cell module, and thus obtainment of a high power generation efficiency compared to the case where the full cells are used. Therefore, the half cells are becoming mainstream of the solar cells constituting the solar cell module.

PRIOR ART DOCUMENT

Patent Document

Patent Document 1: JP 2020-098931 A

SUMMARY OF THE INVENTION

Problem to be Solved by the Invention

When a current of 10 A is generated in a solar cell module formed by connecting a plurality of full cells in series, a current of 5 A is generated in a string of a plurality of half cells connected in series. In this way, when using the half cells, the current value is lowered, and thus the power loss due to series resistance can be reduced. For example, when a solar cell module is formed by connecting, in parallel to each other, two strings each made of 60 half cells connected in series, it can obtain a high power generation efficiency by reducing the loss due to series resistance, compared to a solar cell module made by connecting 60 full cells in series.

FIG. 11 exemplarily shows a solar cell module using general half cells. In a solar cell module 81 using the half cells, a first solar cell string 83 and a second solar cell string 84, both having a structure in which a plurality of half cells is connected in series, are arranged side by side in the longitudinal direction (in the D1 direction in FIG. 11) of the layout of the solar cell module 81, and furthermore are connected in parallel to each other at the middle part of the layout in the longitudinal direction. On the back surface of the middle part, terminal boxes 85 are provided. Hereinafter, the structure of solar cell module in which two solar cell strings each connected in series are connected in parallel to each other (i.e. the structure of the solar cell module 81) is referred to as a "two parallel module structure".

However, the solar cell module is sometimes bent because of load applied by wind pressure, accumulated snow or the like. Especially, an enlarged solar cell module is likely to have a large bending amount. As shown in FIG. 12, the bending amount is maximized at the middle part of the solar cell module 81 in the longitudinal direction (in the D1 direction). In the case of the solar cell module 81 having a slimmed frame member 86, the terminal box 85 may protrude below a bottom part 861 of the frame member 86 formed on a stand 87, which may cause contact of the terminal box 85 with an installation surface 70 such as a roof of a house or a stand structure. Such a contact of the terminal box 85 with the installation surface 70 of the solar cell module 81 is likely to cause damage to the terminal box 85 and/or the installation surface 70.

The present disclosure was made in consideration of the above problems, an object of which is to provide a solar cell module having a two parallel module structure using split cells. The solar cell module with this structure has a power generation effect higher than that of the solar cell module using full cells. Furthermore, when the solar cell module is bent, a terminal box or the like provided on the solar cell module is not likely to make contact with a structure below.

Means for Solving the Problem

As means for achieving the object of the present disclosure, a solar cell module includes a plurality of solar cell strings each of which is made by connecting a plurality of solar cells in series. The solar cell module includes, as the plurality of solar cell strings, a first solar cell string including a plurality of first solar cells each having a first light-receiving area, and a second solar cell string including a plurality of second solar cells each having a second light-receiving area that is different from the first light-receiving area. A parallel connection part is provided so as to connect the first solar cell string and the second solar cell string in parallel to each other. The first solar cell and the second solar cell are split solar cells made by splitting a solar cell before splitting into two solar cells respectively having the first light-receiving area and the second light-receiving area. The first light-receiving area is smaller than the second light-receiving area. The first solar cell string and the second solar cell string are arranged in a first direction of the solar cell module such that the parallel connection part is interposed between the first solar cell string and the second solar cell string. The parallel connection part is provided away from a middle part of the solar cell module in the first direction.

More specific configurations of the solar cell module include the following. In the solar cell module having the above-described configuration, it is preferable that a terminal box is provided at a position corresponding to the parallel connection part so that output wiring members from the first solar cell string and the second solar cell string are connected to the terminal box.

Also, in the above case, a plurality of terminal boxes may be arranged in a second direction orthogonally intersecting the first direction.

Also, in the solar cell module having the above-described configuration, the number of the first solar cells included in the first solar cell string is the same as the number of the second solar cells included in the second solar cell string.

Also, in the solar cell module having the above-described configuration, it is preferable that the following numeral expressions are satisfied:

$$L = L1 + L2;\ \text{and}$$

$$1 > L1/L2 \geq 0.17,$$

where the length of a side of the first solar cell in the first direction is represented by L1 and the length of a side of the second solar cell in the first direction is represented by L2 while the length of a side of the solar cell before splitting, which has a substantially square shape, is represented by L.

With the above-described configuration, the solar cell module having a two parallel module structure using the split cells can obtain a high power generation efficiency compared to the solar cell module using the full cells, while the terminal box or the like is not required to be provided on the middle part of the solar cell module in the longitudinal direction, where the bending amount is likely to increase. Thus, it is possible to prevent generation of damage.

Effects of the Invention

In the present disclosure, a solar cell module has a two parallel module structure using split cells. The solar cell module with this structure has a power generation effect higher than that of the solar cell module using full cells. Furthermore, it is possible to prevent a terminal box from making contact with a structure below when the solar cell module is bent.

BRIEF DESCRIPTION OF THE DRAWINGS

FIG. 1 is a plan view schematically illustrating a configuration of a solar cell module according to an embodiment of the present disclosure.

FIG. 10 is a table showing the maximum output value of the solar cell module.

MODES FOR CARRYING OUT THE INVENTION

Hereinafter, a solar cell module and a photovoltaic power system according to an embodiment of the present disclosure will be described with reference to the drawings.

Figure 1:
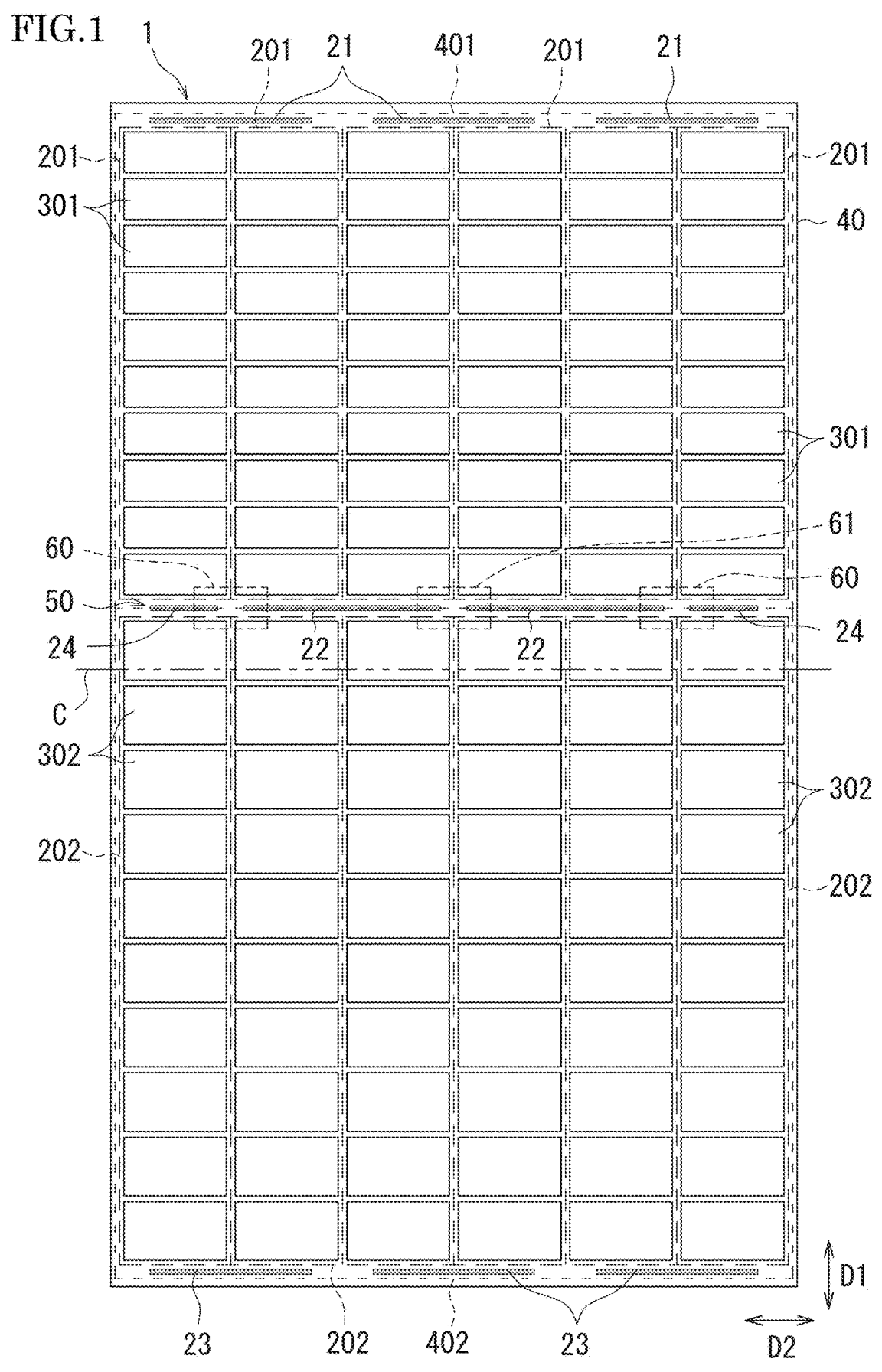
Figure 2:
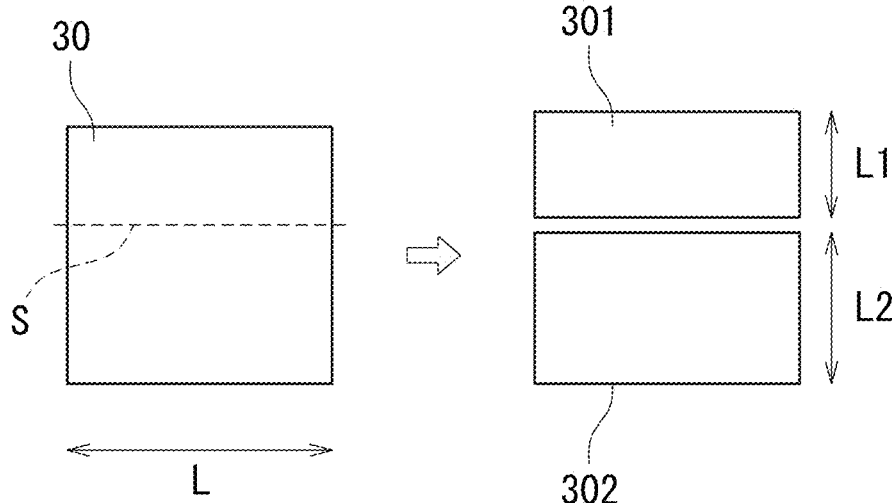
FIG. 2 is an explanatory diagram illustrating solar cells of the solar cell module.
Figure 3:
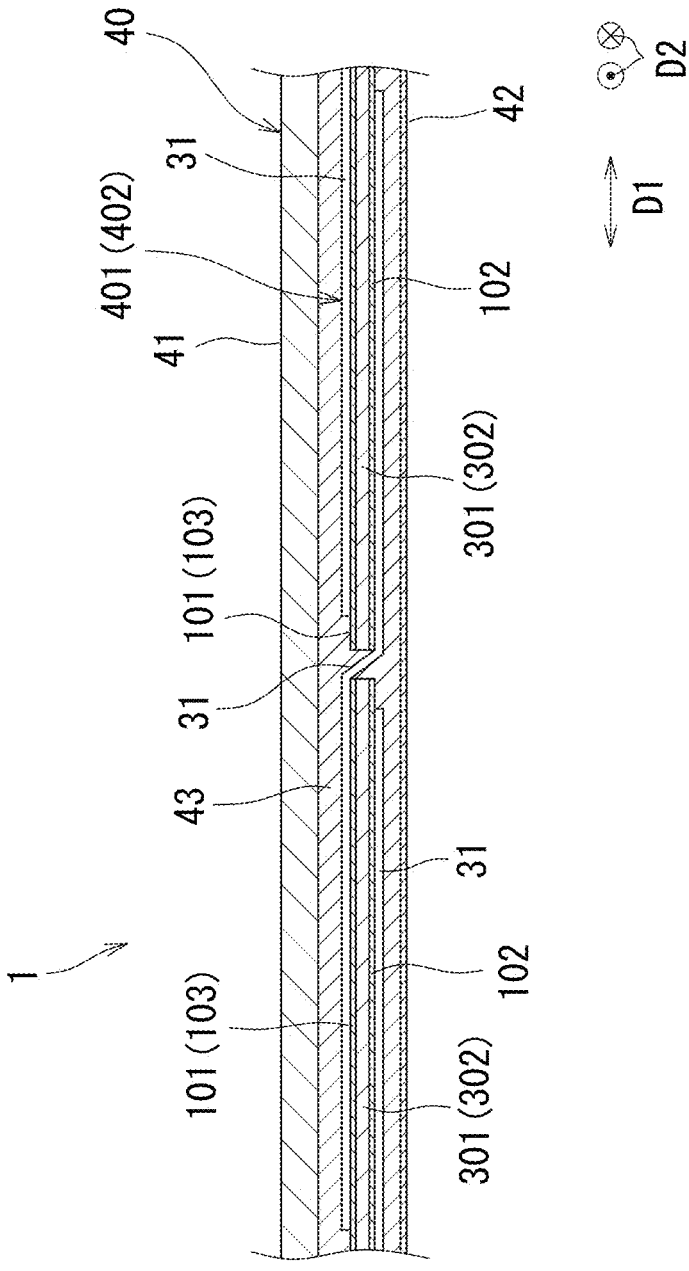
FIG. 3 is a cross-sectional view illustrating an inner structure of the solar cell module.

FIG. 1 is a plan view schematically illustrating a configuration of a solar cell module 1 according to this embodiment of the present disclosure. FIG. 2 is an explanatory diagram illustrating solar cells of the solar cell module 1. FIG. 3 is a cross-sectional view illustrating an inner structure of the solar cell module 1. For the purpose of the description, the up and down direction (column direction) in FIG. 1 is referred to as a first direction D1 while the left and right direction (row direction) is referred to as a second direction D2. Also, a resin layer, a protection member and the like provided on the solar cell module 1 are omitted from FIG. 1.

As shown in FIG. 1, the solar cell module 1 includes: a substantially rectangular-shaped (substantially oblong-shaped) panel 40 extending in the first direction D1; and two pairs of solar cell strings (401, 402) arranged on the panel 40. As the solar cell strings constituting the solar cell module 1, the first solar cell string 401 is made by connecting a plurality of first solar cells 301 in series, and the second solar cell string 402 is made by connecting a plurality of second solar cells 302 in series. The first solar cell string 401 and the second solar cell string 402 are connected in parallel to each other.

The first solar cell 301 and the second solar cell 302 are formed by splitting one standard cell having a standard size (i.e. a solar cell before splitting) 30. As shown in FIG. 2, each of the first solar cell 301 and the second solar cell 302 is a split cell formed by splitting the substantially square-shaped standard cell 30 with the length of one side thereof being L (for example, 166 mm).

As an example, a solar cell as a full cell (i.e. the standard cell 30) can be made by forming a P-N junction on a substantially rectangular-shaped semiconductor substrate so as to form a plurality of collection electrodes on the semiconductor substrate. Then, this standard cell 30 is split into two cells by a straight split line S. The split line S is parallel to one side having the length L and unevenly splits the standard cell 30. In this way, the standard cell 30 is split into: the substantially rectangular-shaped first solar cell 301 with the length of a side orthogonally intersecting the split line S being L1; and the substantially rectangular-shaped second solar cell 302 with the length of a side orthogonally intersecting the split line S being L2.

After the split, the first solar cell 301 has a first light-receiving area of L×L1 in total, while the second solar cell 302 has a second light-receiving area of L×L2 in total, which is different from the first light-receiving area of the first solar cell 301.

As shown in FIG. 2, the split is performed such that the length L1 of the short side of the first solar cell 301 is smaller than the length L2 of the short side of the second solar cell 302. As a result, the first light-receiving area of the first solar cell 301 as one of the split cells is smaller than the second light-receiving area of the second solar cell 302 as the other of the split cells.

The first solar cell 301 and the second solar cell 302 as described above are flat photovoltaic elements that generate electric power by receiving light irradiation, and each include a front surface electrode 101 and a back surface electrode 102 as shown in FIG. 3. Here, an inner structure of the first solar cell string 401 including the first solar cells 301 is exemplarily described. The solar cell module 1 has a configuration in which the first solar cells 301 are sealed by a transparent resin layer 43 between a transparent substrate 41 and a protection member 42.

For example, the front surface electrode 101 includes a busbar electrode 103 and a finger electrode (not shown). The busbar electrode 103 is formed like a linear band extending in the first direction D1 on the front surface of the first solar cell 301. The finger electrode is formed extending in the second direction D2 from both edges of the busbar electrode 103. The finger electrode is provided in such a pattern as to run across the entire light-receiving surface of the first solar cell 301 at fixed intervals therebetween.

The back surface electrode 102 is formed like a linear band extending in the first direction D1 on the back surface of the first solar cell 301 so as to be opposite to the busbar electrode 103. A first connection member 31 is connected to the busbar electrode 103 of the front surface electrode 101 of one first solar cell 301 and also connected to the back surface electrode 102 of the other first solar cell 301, thereby connecting the adjacent first solar cells 301 in series. The transparent substrate 41 is disposed so as to face the front surface of the first solar cell 301 (i.e. provided on the upper side in FIG. 3). The protection member 42 is disposed so as to face the back surface of the first solar cell 301 (i.e. provided on the lower side in FIG. 3).

The first connection member 31 includes a base material formed in the shape of an elongated strip or a wire with a substantially circular cross-section, the outer surface of the base material or wire being coated with either a conductive adhesive or a solder. The material for the base material or wire is not particularly limited, and for example, a metal such as copper may be used. The above inner structure is the same as that of the second solar cell string 402.

In the solar cell module 1 as shown in FIG. 1, the first solar cells 301 and the second solar cells 302 as the plurality of split cells are arranged in a matrix in the first direction D1 and the second direction D2. In the solar cell module 1 in the example, both end parts and a middle part of the panel 40 in the first direction D1 are respectively provided with electrode wiring members 21 to 24. The first solar cell string 401 and the second solar cell string 402 are arranged so as to interpose the electrode wiring members 22 and 24 therebetween.

The first solar cell string 401 includes a plurality of first solar cell groups 201. Each of the first solar cell group 201 is made by connecting, in series, a plurality of first solar cells 301 arranged in the first direction D1. In the example, 10 first solar cells 301 are connected in series, in the first direction D1, by wiring members (not shown) for one first solar cell group 201 of the first solar cell string 401. The short side with the length of L1 of the first solar cell 301 is arranged along the first direction D1.

Also, two adjacent first solar cell groups 201 are connected in series by the electrode wiring member (busbar) 21 or 22. More specifically, two first solar cell groups 201 connected in series by the electrode wiring member 21 are further connected, in series by the electrode wiring member 22, to two first solar cell groups 201 connected in series by the electrode wiring member 21, which are located in the center in the second direction D2.

In this way, the first solar cell string 401 has 6 first solar cell groups 201 in the second direction D2, which means that 60 (10×6) first solar cells 301 are connected in series by the electrode wiring members 21 and 22. The first solar cell groups 201 located at both end parts in the second direction D2 are each electrically connected to the corresponding electrode wiring member 24 at one end part in the first direction D1. The electrode wiring members 24 at both end parts also serve to extract electric power from the plurality of first solar cell groups 201.

Similarly to the above, the second solar cell string 402 includes a plurality of second solar cell groups 202, each of which is made by connecting a plurality of second solar cells 302 in series. In the example, 10 second solar cells 302 are connected in series by wiring members (not shown) for one second solar cell group 202. The short side with the length of L2 of the second solar cell 302 is arranged along the first direction D1. Two adjacent second solar cell groups 202 are connected in series by the electrode wiring member (busbar) 23 or 22.

The second solar cell string 402 is configured by 6 second solar cell groups 202 that are arranged in the second direction D2, which means that 60 (10×6) second solar cells 302 are connected in series. The number of the first solar cells 301 included in the first solar cell string 401 is the same as the number of the second solar cells 302 included in the second solar cell string 402.

Thus, the solar cell module 1 includes the first solar cell string 401 made by 60 first solar cells 301 electrically connected in series and the second solar cell string 402 made by 60 second solar cells 302 electrically connected in series. The first solar cell string 401 and the second solar cell string 402 are electrically connected in parallel to each other by the electrode wiring members 22 and 24 that are located on the middle part (center line C) of the panel 40 of the solar cell module 1 in the first direction D1.

The first solar cell string 401 and the second solar cell string 402 arranged in the first direction D1 are connected in parallel to each other by a parallel connection part 50 that is provided on a boundary part between both solar cell strings 401 and 402. In this case, the respective short sides of the first solar cells 301 constituting the first solar cell string 401 (whose length satisfies the inequality L1<L2) are arranged along the first direction D1, as described above. Therefore, the parallel connection part 50 is provided at a position away from the middle part (center line C) of the panel 40 of the solar cell module 1 in the first direction D1.

Also in the example, 3 terminal boxes 60 and 61 are provided on the back surface of the panel 40 in the second direction D2, at respective positions corresponding to the parallel connection part 50. In each of the terminal boxes 60 provided on both end parts in the second direction D2, the following are installed: an extract terminal connected to the electrode wiring member 24 as the output wiring from the first solar cell string 401 and the second solar cell string 402; and a bypass diode connected to the electrode wiring members 22 and 24. In the terminal box 61 provided on the middle part in the second direction, a bypass diode connected to the two electrode wiring members 22 is installed. These terminal boxes 60 and 61 are provided on the respective positions shifted by a predetermined distance from the center line C of the panel 40 of the solar cell module 1 in the first direction D1 in plan view.

Figure 4:
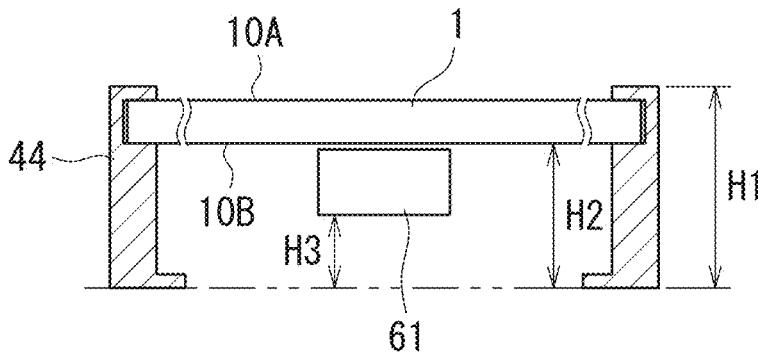
FIG. 4 is an explanatory diagram illustrating an arrangement configuration of a terminal box of the solar cell module.

FIG. 4 is an explanatory diagram illustrating an arrangement configuration of the terminal box 61 provided on the middle part of the solar cell module 1 in the second direction D2. As can be seen from FIG. 4, the terminal box 61 is provided on a back surface 10B that is an opposite surface of a light-receiving surface 10A of the solar cell module 1. FIG. 4 shows the provided position of the terminal box 61 in the front and back direction (up and down direction) along with a frame member 44.

The terminal box 61 is attached to the back surface 10B of the solar cell module 1 in a state in which a peripheral part of the solar cell module 1 is supported by the frame member 44 having the height of H1. The height from the bottom surface of the frame member 44 to the back surface 10B of the solar cell module 1 is set to H2, while the height from the bottom surface of the frame member 44 to the bottom surface of the terminal box 61 is H3.

As described above, there is a tendency to make the frame member 44 thinner for reduction in cost. For example, the height H1 is set to about 30 mm. As a result, when the solar cell module 1 is bent because of load applied by wind pressure, accumulated snow or the like and the bending amount becomes 10 mm or more, the terminal box 61 may move down to exceed the height H3 (for example, 10 mm) and its bottom surface may protrude from the bottom surface of the frame member 44, even when the height H2 is set to 20 mm.

Figure 11:
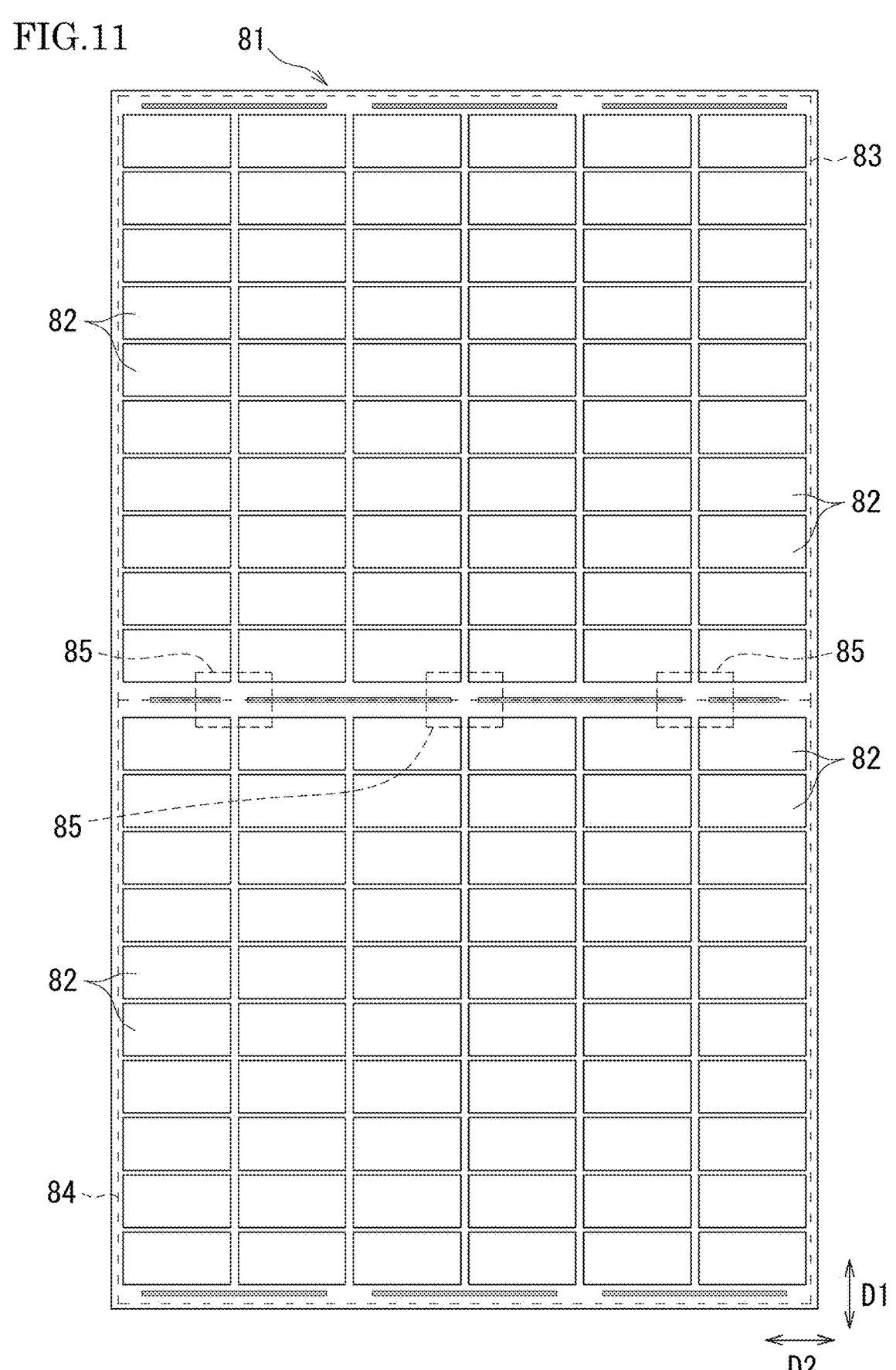
FIG. 11 is a plan view schematically illustrating a configuration of a solar cell module having a two parallel module structure using half cells according to a reference example.
Figure 12:
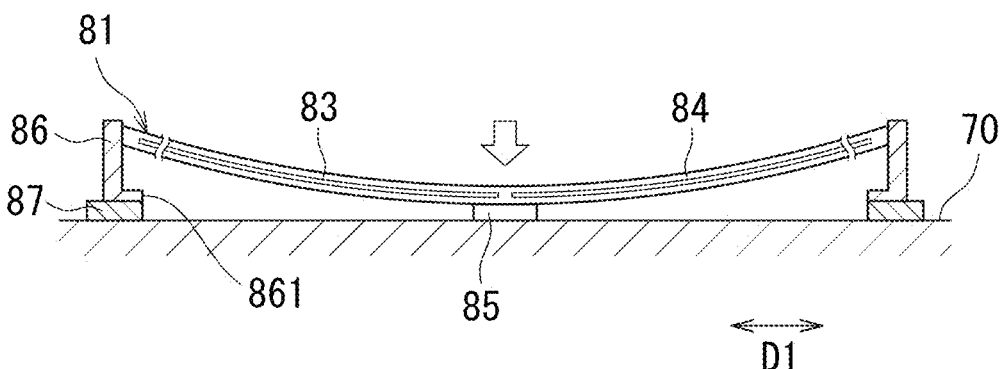
FIG. 12 is an explanatory diagram illustrating a bent generated in the solar cell module having the two parallel module structure using the half cells according to the reference example.

In the solar cell module 81 having the two parallel module structure according to a reference example shown in FIG. 11, the terminal boxes 85 are provided on the middle part of the solar cell module 81 in the longitudinal direction, that is, they are provided on the positions where the bending amount becomes the largest. Therefore, the terminal box 85 is likely to make contact with the installation surface 70 of the solar cell module 81, which may cause damage to the solar cell module 81.

Alternatively, it may be possible to provide a reinforcement member on the back surface of the solar cell module so as to prevent the bending. However, in this case, the weight and the number of components of the solar cell module increase, which is not preferable because the assembly man-hours and the manufacturing cost increase for construction of the solar cell module.

In contrast to the above, in the solar cell module 1 according to this embodiment, the terminal boxes 60 and 61 are provided on the respective positions shifted by a predetermined distance, in the first direction D1, from the center line C of the solar cell module 1 in the longitudinal direction. Thus, it is possible to keep the height from the bottom surface of the frame member 44 to the bottom surfaces of the terminal boxes 60 and 61 within the range of the height of H3 when the bending occurs, which prevents the terminal boxes 60 and 61 from protruding from the bottom surface of the frame member 44. Therefore, it is possible to reduce damage of the terminal boxes 60 and 61 or damage of structures such as roofing materials that form the installation surface 70 due to the contact of the bottom surfaces of the terminal boxes 60 and 61 with the installation surface 70.

Figure 5:
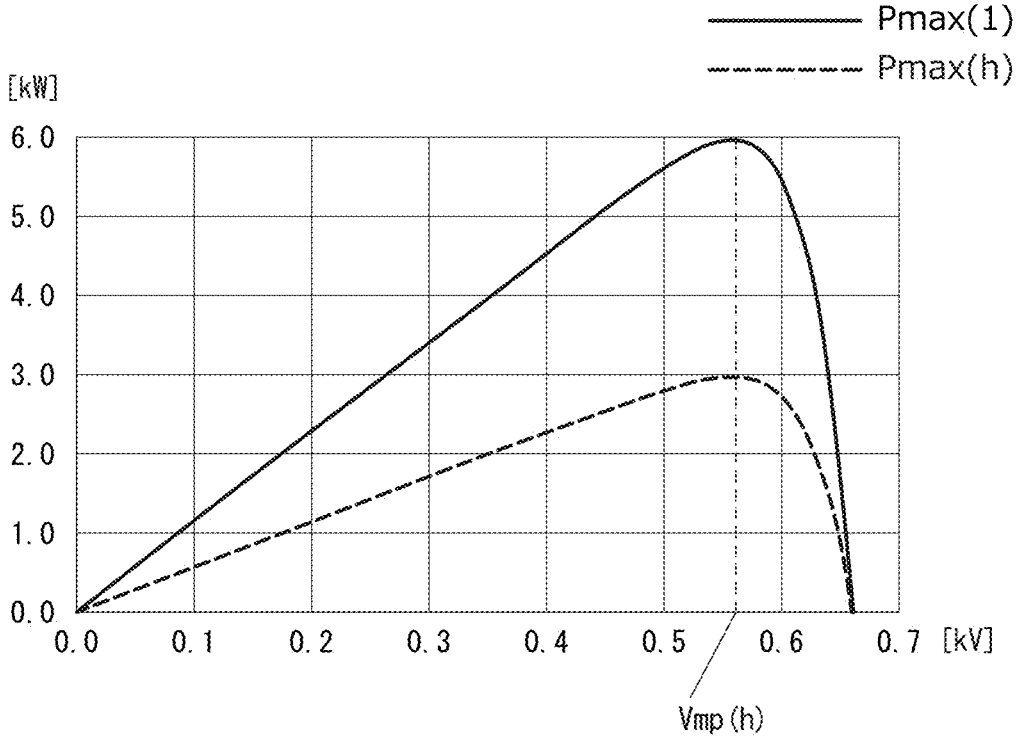
FIG. 5 is a graph showing a relationship between a voltage and an output of the solar cell module in a case of using half cells.
Figure 6:
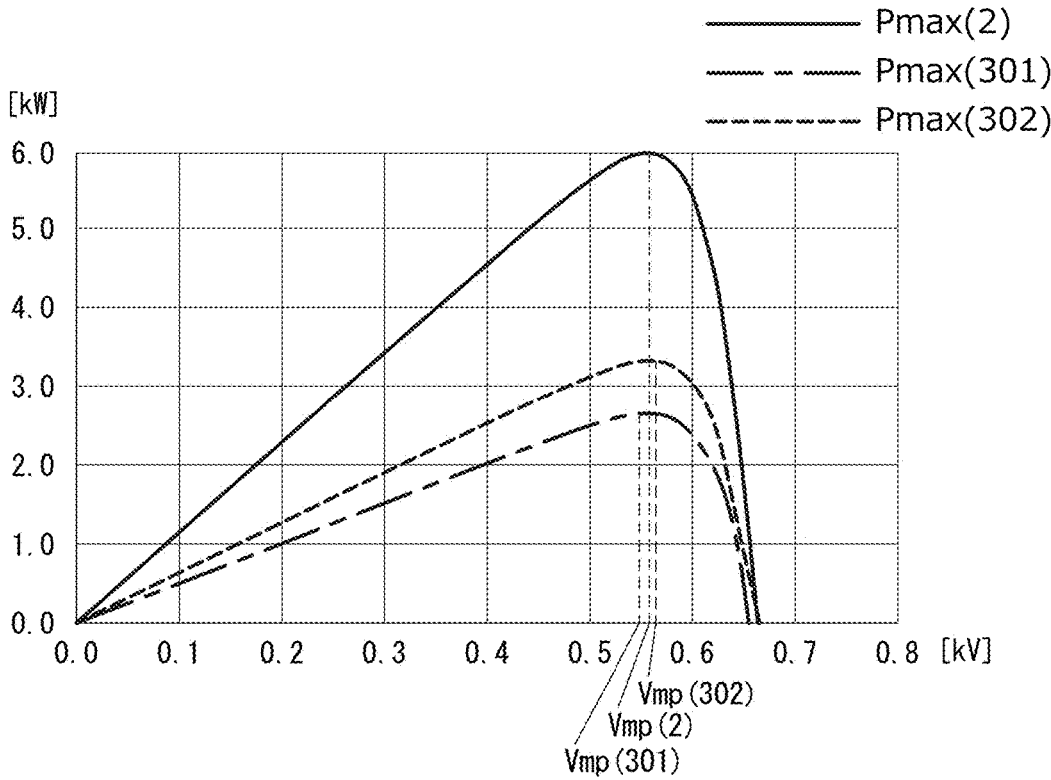
FIG. 6 is a graph showing a relationship between a voltage and an output of the solar cell module according to the embodiment.
Figure 7:
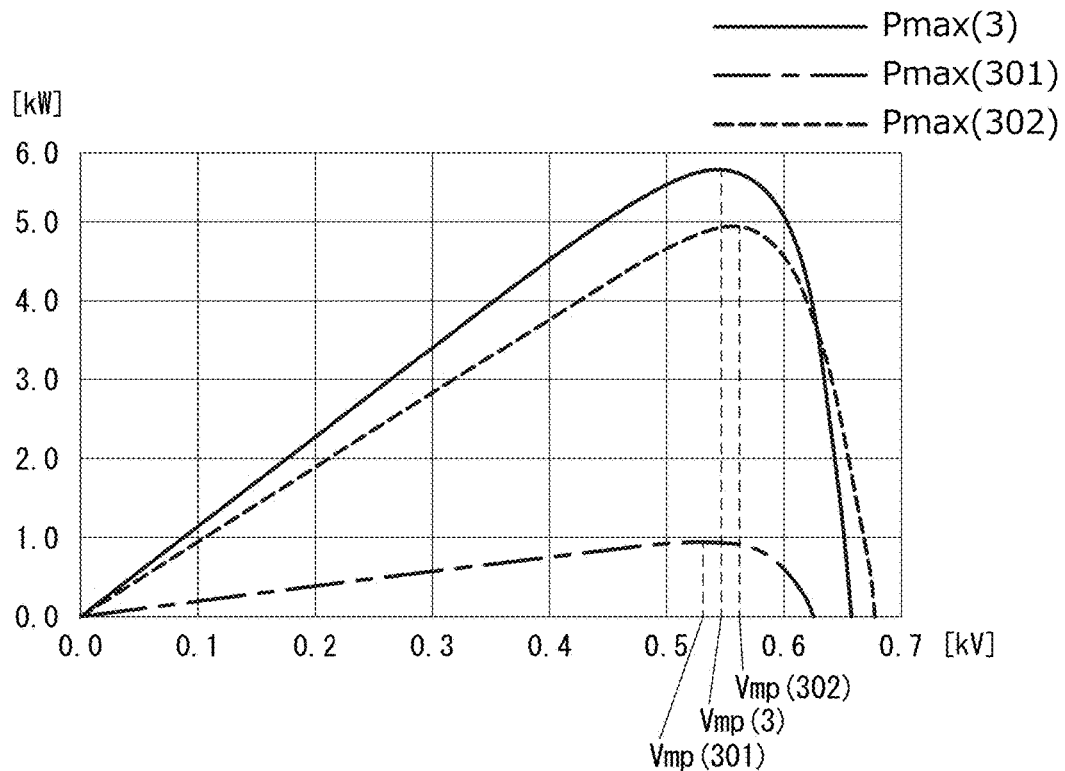
FIG. 7 is a graph showing a relationship between a voltage and an output of the solar cell module according to the embodiment.
Figure 8:
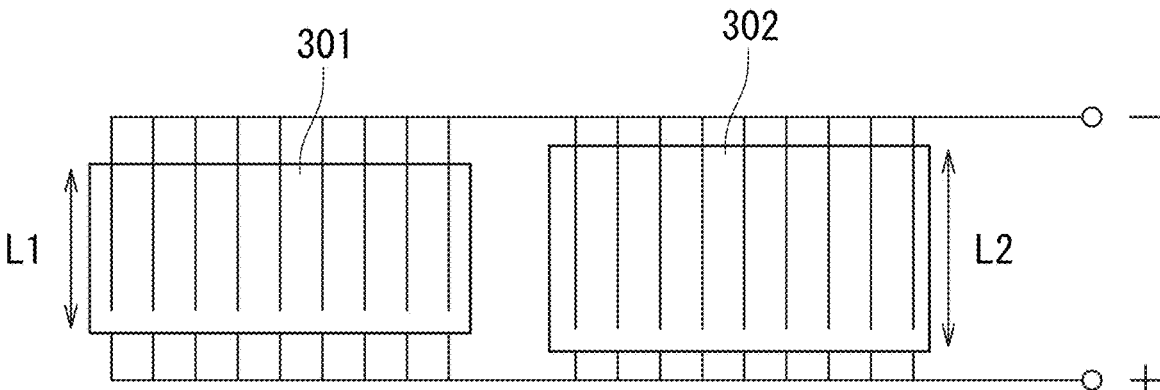
FIG. 8 is an explanatory diagram schematically illustrating a parallel connection of a first solar cell and a second solar cell of the solar cell module according to the embodiment.

FIGS. 5 to 7 are graphs each showing a relationship between a voltage and an output of the solar cell module. FIG. 8 is an explanatory diagram schematically illustrating a parallel connection of the first solar cell 301 and the second solar cell 302 that are made by splitting a solar cell module as a full cell into two cells.

In order to confirm the solar cell characteristics when the first solar cell 301 and the second solar cell 302 having different short sides (i.e. the length of the short side of the first solar cell 301 is L1 while the length of the short side of the second solar cell 302 is L2) are connected in parallel, FIG. 5 shows, as a comparative example, a graph that indicates a voltage and output characteristics of a half cell made by dividing a solar cell into two equal cells, and furthermore indicates a voltage and output characteristics when the two half cells are connected in parallel.

On the other hand, in FIG. 6, the first solar cell 301 and the second solar cell 302 are according to the configuration of the solar cell module 1 in this embodiment. That is, the length L1 of the short side of the first solar cell 301 in the first direction D1 and the length L2 of the short side of the second solar cell 302 in the first direction D1 satisfy the ratio L1/L2 of 0.8. The graph indicates a voltage and output characteristics of each of the above first solar cell 301 and the above second solar cell 302, and furthermore indicates a voltage and output characteristics when one first solar cell 301 and one second solar cell 302 are connected in parallel.

Also in FIG. 7, the first solar cell 301 and the second solar cell 302 are according to the configuration of the solar cell module 1 in this embodiment. The length L1 of the short side of the first solar cell 301 in the first direction D1 and the length L2 of the short side of the second solar cell 302 in the first direction D1 satisfy the ratio L1/L2 of 0.2. The graph indicates a voltage and output characteristics of each of the above first solar cell 301 and the above second solar cell 302, and furthermore indicates a voltage and output characteristics when one first solar cell 301 and one second solar cell 302 are connected in parallel.

The output of the solar cells connected in parallel is the sum of the outputs of the respective solar cells at the same potential. When the half cells made by dividing a solar cell into two equal cells are connected in parallel as shown in FIG. 5, the output of the parallel connection increases simply by two times because in this case the two half cells having the same voltage and output characteristics are connected. The half cell having the maximum output Pmax (h) of 2.985 W was used, thus the maximum output Pmax (1) of the parallel connection was 5.968 W, which was approximately double of that of the half cell.

Unlike the above, here it is considered about the solar cells not the half cells but the solar cells of the solar cell module 1 according to this embodiment, which satisfy the relationship between the lengths of the short sides L1/L2≠1. Like the solar cell module 1 in this embodiment, when the solar cells that are not half cells but satisfy the ratio of the length of the short side L1/L2≠1 are connected in parallel, the maximum output operating voltage VmP (301) of the first solar cell 301 having the shot side length L1 is not the same value as the maximum output operating voltage VmP (302) of the second solar cell 302 having the short side length L2. Therefore, the maximum output when the first solar cell 301 and the second solar cell 302 are connected in parallel is not the sum of the maximum output Pmax (301) of the first solar cell 301 and the maximum output Pmax (302) of the second solar cell 302. The maximum output has tendency to decrease compared to the case where the half cells are connected in parallel.

That is, in the case where the ratio of the length of the short side met L1/L2=0.8 and thus the difference in the length of the short side was not large between the first solar cell 301 and the second solar cell 302 as shown in FIG. 6, the maximum output Pmax (301) of the first solar cell 301 equaled 2.826 W, and the maximum output Pmax (302) equaled 3.145 W. Also, the maximum output Pmax (2) equaled 5.967 W when the solar cells were connected in parallel. Thus, the results showed that there was no great difference between this case and the case of the half cells shown in FIG. 5.

On the other hand, in the case where the ratio of the length of the short side met L1/L2=0.2 and thus the difference in the length of the short side was large between the first solar cell 301 and the second solar cell 302 as shown in FIG. 7, the maximum output Pmax (301) of the first solar cell 301 equaled 0.950 W, and the maximum output Pmax (302) of the second solar cell 302 equaled 4.951 W. Also, the maximum output Pmax (3) equaled 5.884 W when the solar cells were connected in parallel. Thus, the results showed that the output decreased by about 1.4% compared to the case of parallel connection of the half cells shown in FIG. 5.

Here, the first solar cell 301 and the second solar cell 302 were used, which were made by splitting a solar cell (standard cell 30, i.e. full cell) having the length L of 166 mm into two cells that had different short side lengths L1 and L2. Then, as to the solar cell module 1 in which 60 solar cells were connected in series and furthermore two units of the above 60 solar cells were connected in parallel as shown in FIG. 1, the relationship between the ratio of the length L1/L2 and the maximum output Pmax of the solar cell module 1 was calculated using equivalent circuit simulation.

Figure 9:
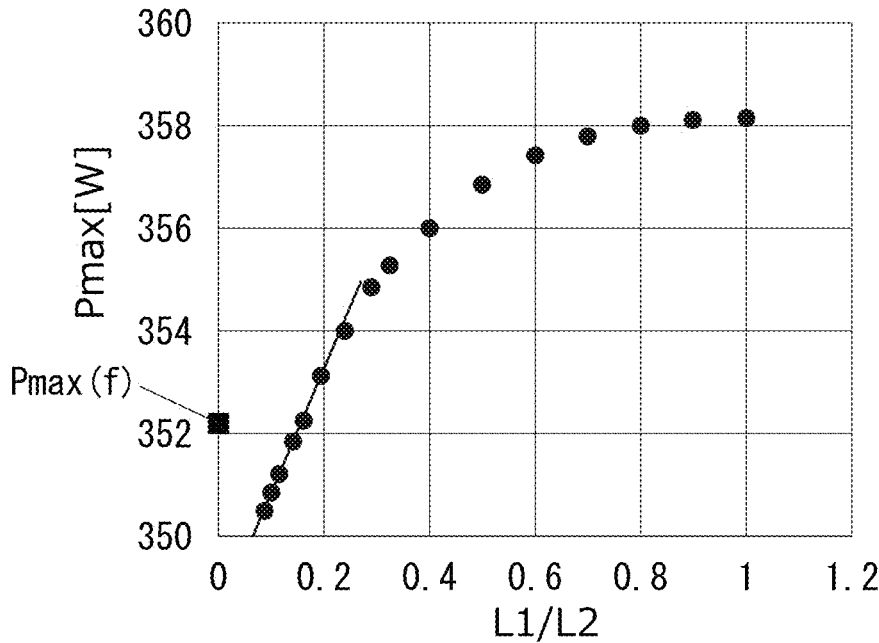
FIG. 9 is a graph showing a maximum output value of the solar cell module.

FIG. 9 is a graph showing the value of the maximum output Pmax of the solar cell module 1, where the short side length L1 and the short side length L2 were changed so that the ratio of the length L1/L2 fell into the range of 0.1 to 1. FIG. 10 is a table showing the values of the ratio of the length L1/L2 and the values of the maximum output Pmax of the solar cell module 1, which are indicated in the graph of FIG. 9.

When the half cells (L1/L2=1) were used, Pmax (1) equaled 358.1 W. When the split cells (L1/L2=0.8) were used, Pmax equaled 358.0 W, which was rarely different from the case of the half cells. When the split cells (L1/L2=0.5) were used, Pmax equaled 356.8 W, which was different from the case of the half cells by 0.4%. When the split cells (L1/L2=0.3) were used, Pmax equaled 354.8 W, which was different from the case of the half cells by 1.0%. When the split cells (L1/L2=0.1) were used, Pmax equaled 350.4 W, which was different from the case of the half cells by 2.1%. Although these differences are not so large, it can be still confirmed that as the value of the ratio of the length of the short side L1/L2 becomes smaller, the maximum output Pmax becomes smaller, as described referring to FIGS. 5 to 7. For the purpose of comparison, FIG. 9 also indicates the maximum output (Pmax (f), 352.2 W) of the solar cell module made by connecting 60 full solar cells (i.e. not split) in series.

As described above, the solar cell module 1 according to this embodiment has a two parallel module structure in which the parallel connection part 50 is not provided on the middle part (center line C) of the module, so as to prevent damage of the terminal box caused by the solar cell module 1 bent by load applied. In order to further reliably prevent the damage of the terminal box, it is preferable to further separate the installation position of the terminal box from the center line C, which however means that the separated distance from the center line C increases. That is, as the value of the ratio of the length of the short side L1/L2 between the first solar cell 301 and the second solar cell 302 becomes smaller, the maximum output Pmax of the solar cell module 1 becomes smaller. However, the intended purpose of the configuration of the solar cell module made by connecting the split cells in parallel is to reduce FF (fill factor) and increase the maximum output (Pmax) of the solar cell module.

Therefore, the desirable solar cell module 1 has a configuration in which the parallel connection part 50 is not provided on the center line C, i.e. satisfies the inequality L1/L2<1 as to the ratio of the length of the short side L1/L2 between the first solar cell 301 and the second solar cell 302. In addition to the above, it is preferable to satisfy, at least, the inequality L1/L2≥0.17 in order to obtain the maximum output (Pmax) higher than that of the solar cell module using not-split solar cells, as can be seen from FIGS. 9 and 10.

In consideration of the above, it is preferable that the length L1 of the short side of the first solar cell 301 in the first direction D1 and the length L2 of the short side of the second solar cell 302 in the first direction D1 satisfy the following numerical expressions, with respect to the length L of one side of the substantially square-shaped standard cell 30:

$$L = L1 + L2; \text{ and}$$
$$1 > L1/L2 \geq 0.17.$$

It is more preferable that the ratio of the length of the short side L1/L2 satisfies the inequality L1/L2≥0.33 because the decrease rate of the Pmax increases when the ratio L1/L2 becomes less than 0.33. It is further preferable that the ratio L1/L2 satisfies the inequality L1/L2≥0.8, which stands comparison with the case where the half cells are used.

With the configuration as described above, it is possible to provide the terminal boxes 60 and 61 away from the vicinity of the center line C where the bending amount becomes large in the solar cell module 1, which leads to prevention of damage of the terminal boxes 60 and 61. Also, since the value of the maximum output of the solar cell module 1 is higher than that of the solar cell module using the full cells, such a configuration can be suitably applied to the enlarged solar cell modules in recent years.

Here, the most preferable location of the parallel connection part 50 (i.e. the most preferable positions of the terminal boxes) depends on: the installation environment (wind speed, snow fall amount or the like) that means how much load is applied to the solar cell module 1; the size of the solar cell module 1 that affects the manufacturing cost (for example, when the size becomes large, the bending amount becomes large even when the same load is applied); and the height of the frame. Thus, the most preferable location is a design value set by the relationship of the above factors, and it is preferable that the value of L1/L2 is defined according to the relationship between the safety of the solar cell module 1 and the maximum output (Pmax) of the solar cell module.

The solar cell module 1 according to the present disclosure is not limited to the configuration described in the above embodiment. For example, the first solar cell 301 and the second solar cell 302 that are provided on the solar cell module 1 may be a single-sided light receiving type or may be a double-sided light receiving type. Each number of the first solar cells 301 and the second solar cells 302 to be arranged is not particularly limited. Also, the size (L) of the solar cell before splitting may have a desired size.

The present disclosure may be implemented in various forms without departing from its spirit and main features. Therefore, the aforementioned embodiments and examples are for only illustrative purposes in every respect and provide no basis for restrictive interpretations. The technical scope of the present disclosure is defined only by the claims and never bound by the embodiments and examples. Any modifications and variations that may lead to equivalents of claimed elements are all included within the scope of the disclosure.

This application claims priority based on Patent Application No. 2022-004582 filed in Japan on Jan. 14, 2022. The entire contents thereof are hereby incorporated in this application by reference.

DESCRIPTION OF THE REFERENCE NUMERALS

1 Solar cell module
10A Light-receiving surface
10B Back surface
101 Front surface electrode
102 Back surface electrode
103 Busbar electrode
201 First solar cell group (solar cell group)
202 Second solar cell group (solar cell group)
30 Standard cell (solar cell before splitting)
301 First solar cell
302 Second solar cell
401 First solar cell string
402 Second solar cell string
50 Parallel connection part
60, 61 Terminal box
70 Installation surface
S Split line
D1 First direction
D2 Second direction

The invention claimed is:

1. A solar cell module including a plurality of solar cell strings, each made by connecting a plurality of solar cells in series, the solar cell module comprising:

a first solar cell string made by connecting, in series, a plurality of first solar cells, each having a first light-receiving area;

a second solar cell string made by connecting, in series, a plurality of second solar cells, each having a second light-receiving area that is different from each first light-receiving area, the first solar cell string and the second solar cell string forming the plurality of solar cell strings; and a parallel connection part connecting, in parallel, the first solar cell string and the second solar cell string to each other, wherein;

each of the plurality of first solar cells and each of the plurality of second solar cells are split solar cells made by splitting a solar cell into two split solar cells, and, respectively, having the first light-receiving area and the second light-receiving area, the first light-receiving area being smaller than the second light-receiving area, the first solar cell string and the second solar cell string are arranged in a first direction of the solar cell module, such that the parallel connection part is interposed between the first solar cell string and the second solar cell string, and the parallel connection part is provided away from a center line of the solar cell module in the first direction.

2. The solar cell module according to claim 1, wherein at least one terminal box is provided at a position corresponding to the parallel connection part, such that output wiring members from the first solar cell string and the second solar cell string are connected to the at least one terminal box.

3. The solar cell module according to claim 2, wherein the at least one terminal box includes a plurality of terminal boxes that is arranged in a second direction orthogonally intersecting the first direction.

4. The solar cell module according to claim 1, wherein a number of the plurality of first solar cells included in the first solar cell string is the same as a number of the plurality of second solar cells included in the second solar cell string.

5. The solar cell module according to claim 1, wherein when a length of a side of each of the plurality of first solar cells in the first direction is represented by L1, a length of a side of each of the plurality of second solar cells in the first direction is represented by L2, and a length of a side of the solar cell before splitting, which has a substantially square shape, is represented by L, the following numeral expressions are satisfied:

$$L = L1 + L2; \text{ and}$$

$$1 > L1/L2 \geq 0.17.$$

\* \* \* \* \*